United States Patent
Karaki

(10) Patent No.: US 7,061,270 B2
(45) Date of Patent: Jun. 13, 2006

(54) SEMICONDUCTOR INTEGRATED CIRCUIT, ELECTRONIC EQUIPMENT, AND TRANSISTOR BACK-GATE VOLTAGE CONTROL METHOD

(75) Inventor: Nobuo Karaki, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 10/820,841

(22) Filed: Apr. 9, 2004

(65) Prior Publication Data

US 2004/0257135 A1 Dec. 23, 2004

(30) Foreign Application Priority Data

Apr. 16, 2003 (JP) ............................. 2003-112088
Feb. 20, 2004 (JP) ............................. 2004-044584

(51) Int. Cl.
*H03K 19/173* (2006.01)

(52) U.S. Cl. ............................. 326/46; 326/81; 326/31

(58) Field of Classification Search .................. 326/46, 326/81, 31, 33, 34, 83; 327/199, 534, 537
See application file for complete search history.

(56) References Cited

U.S. PATENT DOCUMENTS

| | | | | |
|---|---|---|---|---|
| 5,097,151 A | * | 3/1992 | Eerenstein et al. | ............ 326/46 |
| 5,450,025 A | | 9/1995 | Shay | ............................. 326/81 |
| 5,821,769 A | * | 10/1998 | Douseki | ........................ 326/34 |
| 6,031,778 A | | 2/2000 | Makino et al. | |
| 6,034,563 A | * | 3/2000 | Mashiko | ...................... 327/544 |
| 6,107,830 A | | 8/2000 | Okumura | ....................... 326/58 |
| 6,240,019 B1 | | 5/2001 | Shiga et al. | ............ 365/185.22 |
| 6,268,748 B1 | | 7/2001 | Bertin et al. | ................. 327/108 |
| 2004/0095176 A1 | * | 5/2004 | Uvieghara | .................... 327/202 |
| 2005/0004718 A1 | * | 1/2005 | Issa et al. | ..................... 700/304 |

FOREIGN PATENT DOCUMENTS

JP   A 9-83335    3/1997
JP   A 10-261946   9/1998

OTHER PUBLICATIONS

U.S. Appl. No. 10/797,054, filed Mar. 11, 2004, Karaki.

* cited by examiner

*Primary Examiner*—Vibol Tan
(74) *Attorney, Agent, or Firm*—Oliff & Berridge, PLC

(57) ABSTRACT

This invention has as objects the realization of reduced power consumption in a semiconductor integrated circuit, as well as faster transitions of circuits from a standby state to an operating state. In order to achieve these objects, a semiconductor integrated circuit of this invention comprises a plurality of circuit blocks capable of transitions from an operating state to a standby state and from a standby state to an operating state, and a master unit which controls, in event-driven fashion, the back-gate voltages of transistors forming logic elements of the circuit blocks, based on a finite state machine which stipulates in advance each of the state transitions of the plurality of circuit blocks.

23 Claims, 8 Drawing Sheets

FINITE STATE MACHINE

SEMICONDUCTOR INTEGRATED CIRCUIT, ELECTRONIC EQUIPMENT, AND TRANSISTOR BACK-GATE VOLTAGE CONTROL METHOD

BACKGROUND OF THE INVENTION

1. Field of the Invention

This invention relates to transistor back-gate voltage control technology to realize reduced power consumption of semiconductor integrated circuits.

2. Description of the Related Art

Japanese Patent Laid-open No. 9-83335 discloses technology in which a VLSI (Very Large Scale Integration) circuit is divided into a plurality of circuit blocks, switching transistors are positioned between each circuit block and at least either one of a common power supply line and a common ground line, and when a circuit block is in a standby state, the back-gate voltage is controlled such that the threshold voltage of the switching transistor rises, and the switching transistor is turned off. By using this technology, leakage currents (turn-off currents) in the standby state can be decreased, so that power consumption can be reduced.

However, in the above-described technology of the prior art, the back-gate voltage of switching transistors is controlled for the entire circuit on a chip or for each comparatively large circuit block, such as the CPU core or coprocessor, so that the switching transistors are not used to reduce leakage currents of a plurality of finer grain circuits. There is a problem that leakage currents from the sub-circuits during operating state sum up to large amount of current. Further, the larger scale of the circuit is to be controlled, the more time it takes for the back-gate voltage to be settled during switching, so that there is the problem that delays occur in transitions from the standby state to the operating state. Also, in the above-described technology of the prior art, because the power of circuit blocks is occasionally shut down to reduce leakage current, the circuit blocks cannot hold the states. Hence in case of the sequential circuit block, every time a transition from the standby state to the operating state takes place, the initial or current state of the sequential circuits shall be resumed through the sequence of procedure and or by the additional circuit, and then there are the problems that the circuit scale tends to increase and that transitions from the standby state to the operating state become slower.

SUMMARY OF THE INVENTION

Hence an object of this invention is to provide technology to realize further reductions in the power consumption of semiconductor integrated circuits, while achieving faster transitions of circuits from a standby state to an operating state.

In order to attain the above object, a semiconductor integrated circuit of this device comprises a plurality of circuit blocks capable of transitions from an operating state to a standby state and from a standby state to an operating state, and a control circuit that controls, in event-driven fashion, the back-gate voltage of transistors forming the logic elements of circuit blocks based on a finite state machine that stipulates in advance each of the state transitions of the plurality of circuit blocks. By means of this configuration, transistor back-gate voltage can be controlled based on the operating states of circuit blocks, so that leakage currents for the entire semiconductor integrated circuit can be efficiently reduced.

In a preferred embodiment of this invention, when a circuit block is in the standby state, the control circuit controls the back-gate voltage such that the transistor threshold voltage is increased. When the circuit block is in the standby state, by controlling the back-gate voltage such that the transistor threshold voltage rises, the leakage current in the standby state can be reduced. In particular, fine-grain division by functions into numerous circuit blocks can precisely control the leakage currents of individual circuit blocks, so that the leakage current of the entire semiconductor integrated circuit can be greatly reduced.

In a preferred embodiment of this invention, when a circuit block is in the operating state, the control circuit controls the back-gate voltage such that the transistor threshold voltage is lowered. By controlling the back-gate voltage such that the transistor threshold voltage is lowered when the circuit block is in the operating state, low-voltage operation of the circuit becomes possible.

In a preferred embodiment of this invention, the semiconductor integrated circuit further comprises a common power supply line to provide power to each of the plurality of circuit blocks, a common ground line to ground each of the plurality of circuit blocks, and switching elements to electrically connect/disconnect circuit blocks and at least either one of the common power supply line and the common ground line, and the control circuit to control the connection/disconnection of the switching elements, in event-driven fashion, based on a finite state machine. By providing switching elements to turn on and off the power to each of the circuit blocks, the leakage current from the circuit blocks during standby can be reduced.

A semiconductor integrated circuit of this invention comprises a plurality of circuit blocks capable of transitions from an operating state to a standby state and from a standby state to an operating state, channels to actively issue operation requests through communication between circuit blocks by a CSP method or to accept operation requests passively, and ports which interconnect the circuit blocks via the channels; the ports control the back-gate voltage of transistors forming the logic elements of circuit blocks according to the operating states of circuit blocks. By means of this configuration, each of the circuit blocks communicates with other circuit blocks by a CSP method, and when active or passive operation is required, the back-gate voltage is controlled via ports, so that leakage currents for the entire semiconductor integrated circuit can be efficiently reduced.

In a preferred embodiment of this invention, when a circuit block is in the standby state, the channels and ports control the back-gate voltage such that the transistor threshold voltage rises. By means of this configuration, leakage currents from each of the circuit blocks in the standby state can be reduced.

In a preferred embodiment of this invention, when a circuit block is in the operating state, the channels and ports control the back-gate voltage such that the transistor threshold voltage is lowered. By means of this configuration, low-voltage operation of transistors is enabled, and the power consumption of the semiconductor integrated circuit can be reduced.

A preferred embodiment of this invention further comprises a common power supply line to supply power to each of the plurality of circuit blocks, a common ground line to ground each of the plurality of circuit blocks, and switching elements, between the circuit blocks and at least either one of the common power supply line and the common ground line, to perform electrical connection/disconnection and ports to control the connection/disconnection of the switching elements according to the state transitions of circuit blocks. By providing switching elements to turn on and off the power to each of the circuit blocks, leakage currents from circuit blocks during standby can be reduced.

In a preferred embodiment of this invention, the transistors forming the logic elements of circuit blocks, or the switching elements controlling switching of power supplied to circuit blocks, may be MOS transistors. Controlling back-gate voltage of MOS transistors can suppress the leakage currents.

In a preferred embodiment of this invention, the control circuit controls the MOS transistor back-gate voltage such that the threshold voltage when in the non-conducting state is higher than the threshold voltage when the MOS transistor is in the conducting state. By this means, leakage currents from the circuit block can be efficiently suppressed.

It is preferable that wells in which logic elements composing the circuit block are formed and wells in which MOS transistors switching the power supplied to the circuit blocks are formed are separated. Through this configuration, the back-gate voltage of MOS transistors acting as switching elements and the back-gate voltage of transistors forming logic elements can be controlled without exerting influence on each other.

In a preferred embodiment of this invention, transistors forming the logic elements of circuit blocks, or switching elements switching the power supplied to circuit blocks, may be TFTs of a double-gate structure (double-gate TFTs). The structure of double-gate TFTs can achieve faster operation and lower power consumption than single-gate TFTs.

The double-gate TFTs may preferably have the drain and source extensions of LDD structure. The drain and source extension are lightly doped by implanting impurity ions. The LDD structure weakens the electric field in the depletion layer at the surface of the substrate is weakened, and then leakage currents can be reduced.

It is preferable that the gate electrode and back-gate electrode of a double-gate TFT be positioned in opposition with the channel region there between, and that the two be formed in substantially the same shape, so that the shapes thereof projected into the above channel region overlap. By enclosing the top and bottom of the channel region between the gate electrode and back-gate electrode, the subthreshold factor can be made small, and electric field mobility can be improved.

Further, it is preferable that the back-gate electrode be formed such that the shape projected into the channel region overlap with all of or a portion of the LDD region. By this means, it is possible to both reduce the leakage current during transistor standby, and to improve the electric field mobility during transistor operation.

Electronic equipment of this invention comprises a semiconductor integrated circuit of this invention. By mounting a semiconductor integrated circuit of this invention, power consumption can be lowered, making application appropriate in battery-driven portable equipment and similar in particular.

A back-gate voltage control method of this invention controls, in event-driven fashion, the back-gate voltage of transistors forming logic elements in circuit blocks, based on a finite state machine which stipulates in advance each of the state transitions of a plurality of circuit blocks capable of transitions from an operating state to a standby state and from a standby state to an operating state. By means of this configuration, the back-gate voltages of transistors can be controlled based on the operating states of circuit blocks, so that the leakage current of an entire semiconductor integrated circuit can be efficiently reduced.

A semiconductor integrated device of this invention comprises a plurality of circuit blocks capable of state transitions from an operating state to a standby state and from a standby state to an operating state, channels to actively issue operating requests through communications between circuit blocks by a CSP method or to accept operation requests passively, and ports which interconnect the circuit blocks via the channels; the semiconductor integrated device uses a back-gate voltage control method, in which the channels and ports control the back-gate voltage of transistors forming logic elements of circuit blocks, based on the circuit block operating state. By means of this configuration, individual circuit blocks communicate with other circuit blocks via a CSP method, and when active or passive operation is necessary back-gate voltages are controlled via ports, so that leakage currents for the entire semiconductor integrated device can be efficiently reduced.

DESCRIPTION OF THE PREFERRED EMBODIMENTS

Embodiment 1 of the Invention

Figure 1:
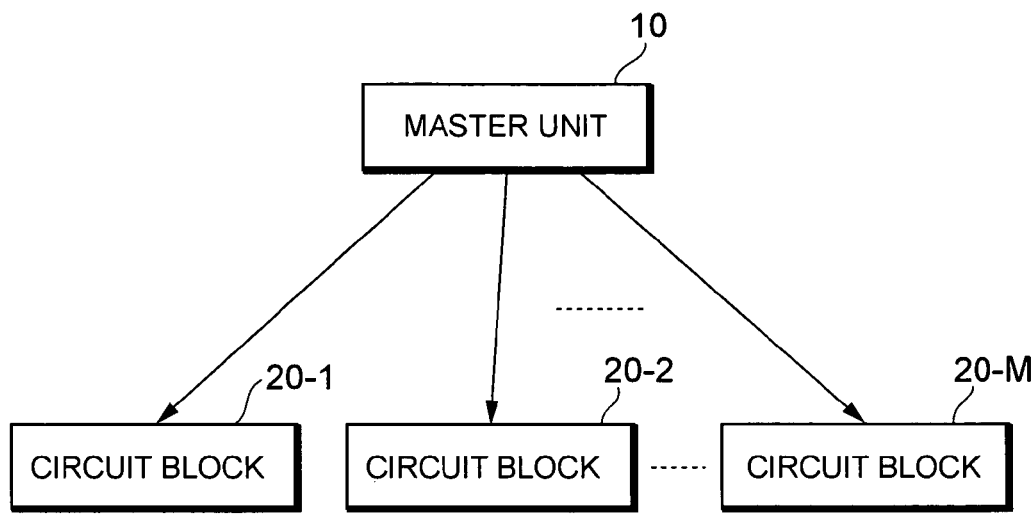
FIG. 1 is a system block diagram of a first embodiment.

FIG. 1 is a block diagram of a system in which a master unit executes centralized control of the back-gate voltages for a plurality of circuit blocks. Semiconductor integrated devices on a VLSI chip are divided into M circuit blocks (logic blocks) 20-1, 20-2, . . . , 20-M capable of transitions from a standby state to an operating state and from an operating state to a standby state. In order to lower the power consumption of the VLSI chip as a whole, it is desirable that the circuits be divided into numerous circuit blocks, categorized by function. The master unit (control circuit) 10 is a event-driving system, with data flow and control logic configured at the VLSI logic design level, to execute unified centralized control of the back-gate voltages of the circuit blocks 20-1, 20-2, . . . , 20-M.

Figure 2:
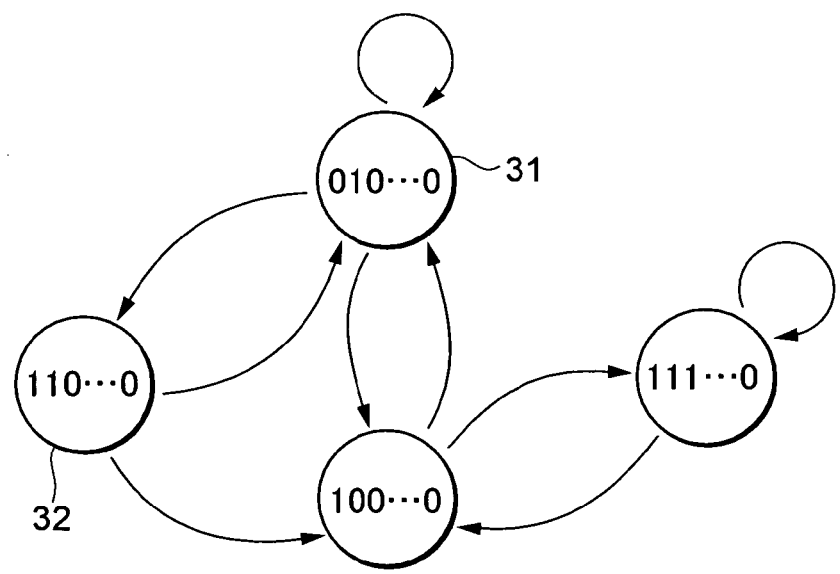
FIG. 2 is a state transition diagram of a finite state machine performing power distribution control.

FIG. 2 is a state transition diagram of a finite state machine that realizes the back-gate voltage control logic of the master unit 10. The standby states of the M circuit blocks 20-1, 20-2, . . . , 20-M correspond to "0", and the operating states correspond to "1"; if the state of the finite state machine is expressed by an M-bit binary number, then $2^M$ states are necessary to control the back-gate voltages of all of the circuit blocks 20-1, 20-2, . . . , 20-M. The states of the finite state machine together stipulate all combinations of the standby state "0" and operating state "1" for all the circuit blocks 20-1, 20-2, . . . , 20-M. If "0" and "1" in the kth digit ($1 \leq k \leq M$) of the binary number representing the state of the finite state machine respectively represent the "standby state" and "operating state" of the circuit block 20-k, then the state indicated by the symbol 31 in the figure indicates that the circuit block 20-2 is in the operating state, since the second digit of the binary number is "1". Similarly, the first and second digits of the binary number for the state indicated by the symbol 32 are both "1", indicating that the circuit blocks 20-1 and 20-2 are in the "operating state". State transitions of the finite state machine are event-driven; by associating the operating states of the circuit blocks 20-1, 20-2, . . . , 20-M with the states of the finite state machine, the master unit 10 performs back-gate voltage control of all the circuit blocks on the VLSI chip.

For convenience in the explanation, the relation between "input" and "output" in each of the states of the finite state machine is omitted. Also, in order to supply power to the circuit blocks 20-1, 20-2, . . . , 20-M via switching elements, described below, the master unit 10, in addition to controlling the back-gate voltages of transistors forming logic elements, also controls the gate voltages and back-gate voltages of these switching elements. In the following explanations, a first configuration example is given in which power supplied to the circuit blocks 20-1, 20-2, . . . , 20-M is turned on and off via switching elements, and a second configuration example is given in which the power supply line to the circuit blocks 20-1, 20-2, . . . , 20-M is always connected and power is supplied.

FIRST CONFIGURATION EXAMPLE

Figure 3:
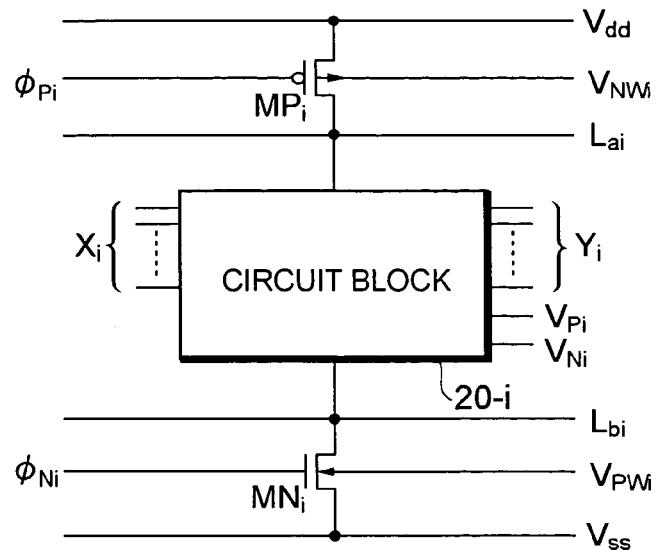
FIG. 3 is a circuit diagram (configuration example 1) showing a system of supply of power to a circuit block.

FIG. 3 is a circuit diagram showing a system of supply of power to a circuit block in a first configuration example. Here, the power supply system for the ith circuit block 20-$i$ is shown, but the other circuit blocks comprise similar circuit configurations. In the figure, the common power supply line $V_{dd}$ is a power supply line to supply power to all the circuit blocks 20-1, 20-2, . . . , 20-M, and the common ground line $V_{ss}$ is a ground line to ground all the circuit blocks 20-1, 20-2, . . . , 20-M. The circuit block 20-$i$ is connected to a partial power supply line Lai to supply power locally and to a partial ground line Lbi to provide a local ground, which are respectively connected to the common power supply line $V_{dd}$ and the common ground line $V_{ss}$ via, respectively, the PMOS transistor MPi and the NMOS transistor MNi as switching elements.

In the figure, $\phi_{Pi}$ is the gate voltage of the PMOS transistor MPi, $V_{NWi}$ is the back-gate voltage of the same transistor MPi, $\phi_{Ni}$ is the gate voltage of the NMOS transistor MNi, $V_{PWi}$ is the back-gate voltage of the same transistor MNi, $X_i$ is the input signal to the circuit block 20-$i$, $Y_i$ is the output signal from the same circuit block 20-$i$, $V_{Ni}$ is the back-gate voltage of the PMOS transistors forming logic elements of the circuit block 20-$i$, and $V_{Pi}$ is the back-gate voltage of the NMOS transistors forming logic elements of the circuit block 20-$i$.

Figure 5:
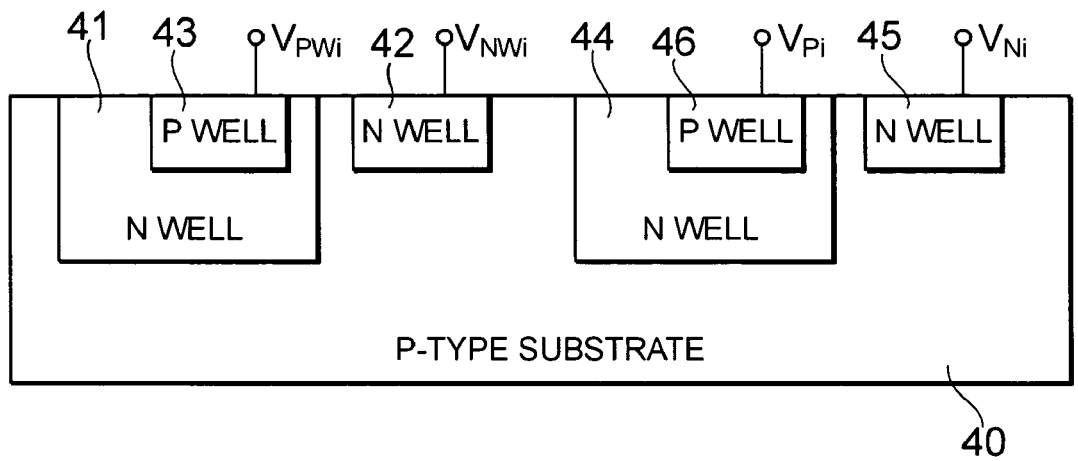
FIG. 5 shows the well structure of a VLSI chip.

FIG. 5 shows the well structure of a VLSI chip. N wells 41, 42, 44, 45 are formed independently in the P-type substrate 40, and within the N well 41 a P well 43 is formed, and within the N well 44 a P well 46 is formed, in triple-well structures. The P well 43 is a well used to form the above-described NMOS transistor MNi, and the well voltage $V_{PWi}$ indicates the back-gate voltage of this transistor MNi. The N well 42 is a well used to form the above-described PMOS transistor MPi, and the well voltage $V_{NWi}$ indicates the back-gate voltage of this transistor MPi. The N well 45 and P well 46 are wells used to form a PMOS transistor and NMOS transistor to constitute a logic element within the circuit block 20-$i$. The well voltage $V_{Pi}$ indicates the back-gate voltage of the NMOS transistor, and the well voltage $V_{Ni}$ indicates the back-gate voltage of the PMOS transistor.

Figure 6:
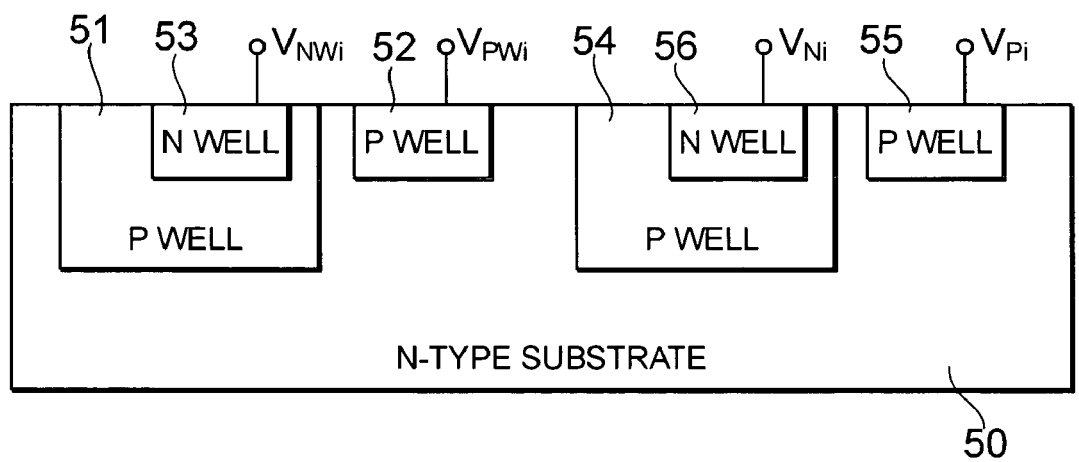
FIG. 6 shows the well structure of a VLSI chip.

The well structure of a VLSI chip is not limited to the above configuration, and for example the well structure of FIG. 6 may be used. The well structure of this figure is based on an N-type substrate 50 in place of the above P-type substrate 40. The P wells 51, 52, 54, 55 are formed independently in the N-type substrate 50; in the P well 51 is formed an N well 53, and in the P well 54 is formed an N well 56, in a triple-well structure. The N well 54 is a well to form the above PMOS transistor MPi, and the well voltage $V_{NWi}$ thereof indicates the back-gate voltage of the transistor MPi. The P well 52 is a well to form the above NMOS transistor MNi, and the well voltage $V_{PWi}$ thereof indicates the back-gate voltage of the same transistor MNi. The P well 55 and N well 56 are wells to form an NMOS transistor and PMOS transistor which constitute a logic element in the circuit block 20-$i$. The well voltage $V_{Pi}$ indicates the back-gate voltage of the NMOS transistor, and the well voltage $V_{Ni}$ indicates the back-gate voltage of the PMOS transistor.

Figure 4:
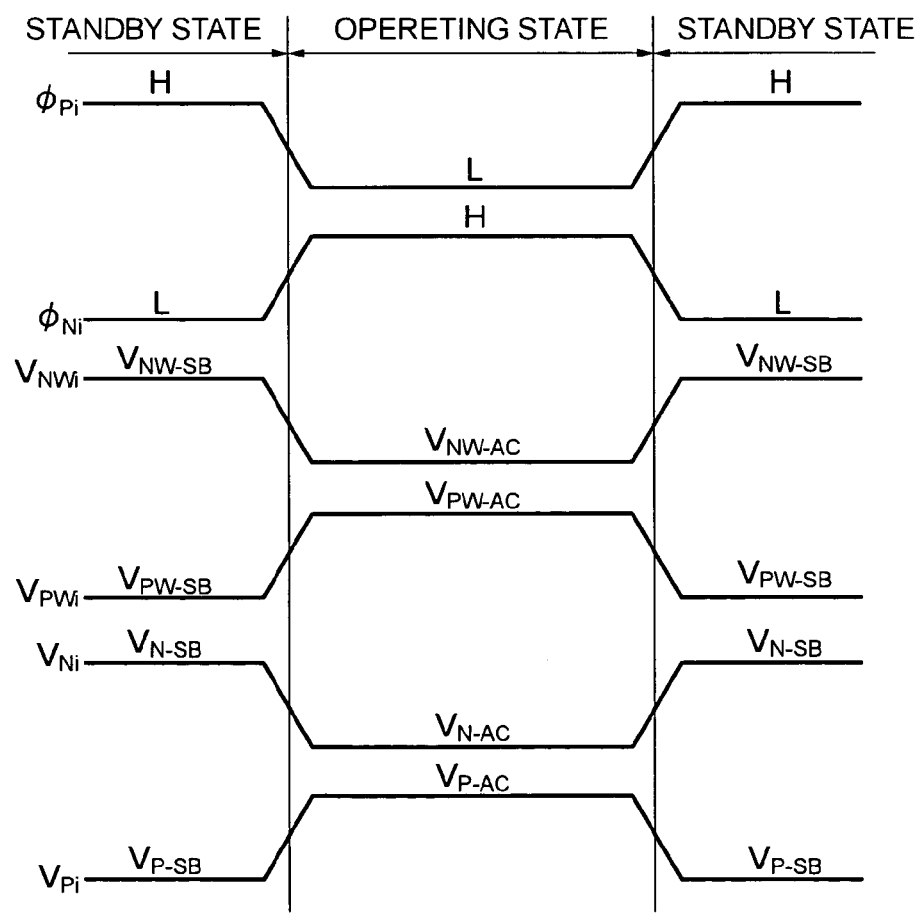
FIG. 4 is a back-gate voltage timing chart.

FIG. 4 is a timing chart showing changes in the back-gate voltage in the operating state and standby state of the circuit block 20-$i$. As stated above, the master unit 10 controls the standby/operating states of the circuit block 20-$i$ according to each of the states of the finite state machine, which makes transitions in an event-driven fashion. In order to cause a transition of the circuit block 20-$i$ to the standby state, the master unit 10 applies logic level H as the gate voltage $\phi_{Pi}$ of the PMOS transistor MPi, and applies logic level L as the gate voltage $\phi_{Ni}$ of the NMOS transistor MNi. The PMOS transistor MPi and NMOS transistor MNi are then both turned off, and the partial power supply line Lai and partial ground line Lbi are electrically isolated from the common power supply line $V_{dd}$ and from the common ground line $V_{ss}$ respectively.

Further, the master unit 10 raises the back-gate voltage $V_{NWi}$ of the PMOS transistor MPi above the voltage $V_{NW-AC}$ during operation, taking this to be $V_{NW-SB}$, and lowers the back-gate voltage $V_{PWi}$ of the NMOS transistor MNi below the voltage $V_{PW-AC}$ during operation, taking this to be $V_{PW-SB}$. Due to the body effect of the PMOS transistor MPi and NMOS transistor MNi, the threshold voltages are increased, so that leakage currents during standby can be reduced.

The master unit 10 similarly raises the back-gate voltage $V_{Ni}$ of a PMOS transistor constituting a logic element in the circuit block 20-$i$ above the voltage $V_{N-AC}$ during operation, setting this equal to $V_{N-SB}$, and lowers the back-gate voltage $V_{Pi}$ of an NMOS transistor below the voltage $V_{P-AC}$ during operation, setting this equal to $V_{P-SB}$. By this means, the threshold voltages of transistors forming logic elements in the circuit block 20-$i$ can be increased, and the leakage currents in the circuit block 20-$i$ in the standby state can be reduced.

On the other hand, the master unit 10 applies logic level L as the gate voltage $\phi_{Pi}$ of the PMOS transistor MPi, and applies logic level H as the gate voltage $\phi_{Ni}$ of the NMOS transistor MNi, in order to cause a transition of the circuit block 20-$i$ to the operating state. Then, the PMOS transistor MPi and NMOS transistor MNi are both turned on, and the partial power supply line Lai and partial ground line Lbi are in a state of electrical connection to the common power supply line $V_{dd}$ and to the common ground line $V_{ss}$ respectively.

In addition, the master unit 10 lowers the back-gate voltage $V_{NWi}$ of the PMOS transistor MPi below the voltage $V_{NW-SB}$ during standby, taking this to be $V_{NW-AC}$, and raises the back-gate voltage $V_{Wi}$ of the NMOS transistor MNi above the voltage $V_{PW-SB}$ during standby, taking this to be $V_{PW-AC}$. The threshold voltages of the PMOS transistor MPi and NMOS transistor MNi are then lowered, and power can be supplied quickly to the circuit block 20-$i$. At the same time, the master unit 10 lowers the back-gate voltage $V_{Ni}$ of the PMOS transistors constituting logic elements in the circuit block 20-$i$ below the standby voltage $V_{N-SB}$, taking this to be $V_{N-AC}$, and raises the back-gate voltage $V_{Pi}$ of NMOS transistors above the standby voltage $V_{P-SB}$, taking this to be $V_{P-AC}$. By reducing the threshold voltages of transistors constituting logic elements, drops in the speed of operation of the circuit block in low-voltage operation can be suppressed, but at the price of an increase in leakage current. By means of this invention, leakage currents during standby can be suppressed in finer detail for each circuit block, and as a result the power consumption for the entire circuit can be suppressed.

SECOND CONFIGURATION EXAMPLE

Figure 7:
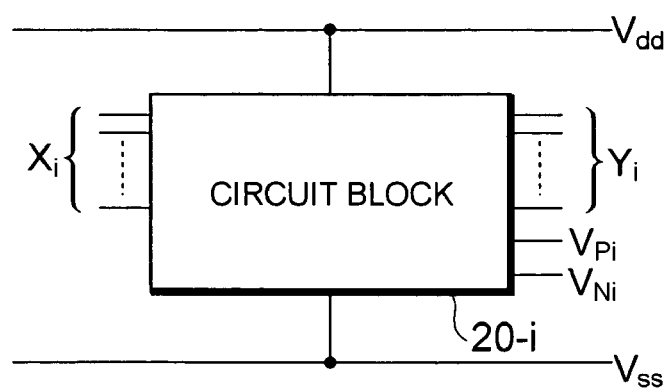
FIG. 7 is a circuit diagram (configuration example 2) showing a system of supply of power to a circuit block.

FIG. 7 is a circuit diagram showing a system of supply of power to a circuit block in a second configuration example. Here, the system for power supply to the ith circuit block 20-$i$ is shown, but the other circuit blocks comprise similar circuit configurations. In the figure, the common power supply line $V_{dd}$ is a power supply line to supply power to all the circuit blocks 20-1, 20-2, . . . , 20-M, and the common ground line $V_{ss}$ is a ground line to ground all the circuit blocks 20-1, 20-2, . . . , 20-M. In this way, the circuit block 20-$i$ is configured to always receive power. In the figure, $X_i$ is the input signal to the circuit block 20-$i$, $Y_i$ is the output signal from the same circuit block 20-$i$, $V_{Ni}$ is the back-gate voltage of PMOS transistors constituting logic elements in the circuit block 20-$i$, and $V_{Pi}$ is the back-gate voltage of NMOS transistors constituting logic elements in the circuit block 20-$i$.

Figure 9:
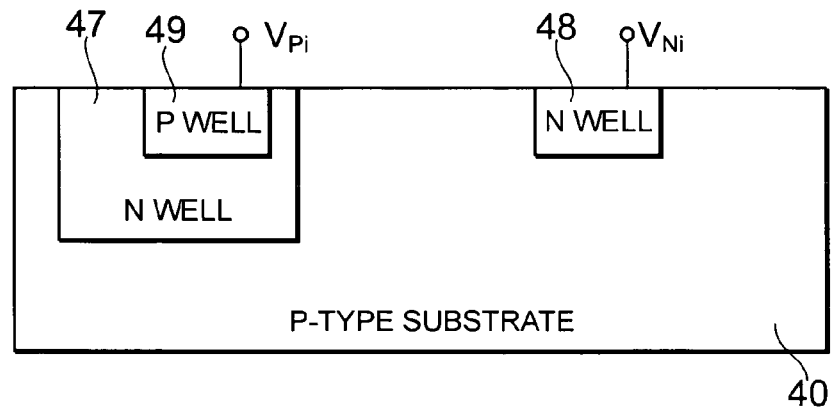
FIG. 9 shows the well structure of a VLSI chip.
Figure 10:
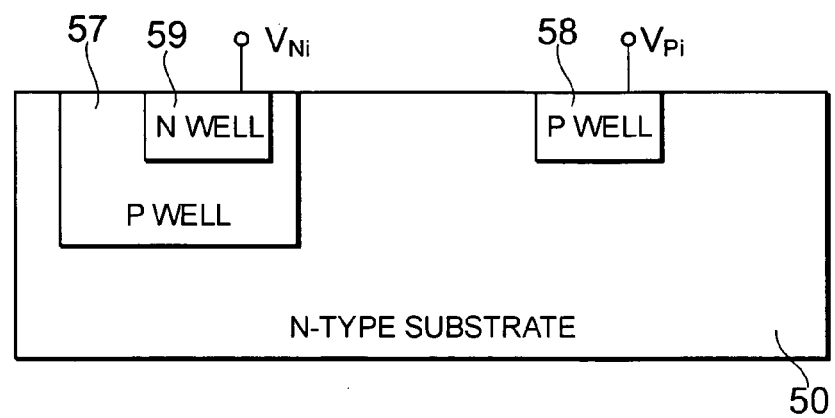
FIG. 10 shows the well structure of a VLSI chip.

FIG. 9 shows the well structure for forming logic elements in the circuit block 20-$i$. As shown in the figure, with the P-type substrate 40 as a base, the N wells 47 and 48 are formed, and within the N well 47 the P well 49 is formed, in a triple-well structure. The well voltage $V_{Pi}$ is the back-gate voltage of the NMOS transistor constituting a logic element, and the well voltage $V_{Ni}$ is the back-gate voltage of the PMOS transistor constituting a logic element. The well structure in the circuit block 20-$i$ is not limited to the structure shown in FIG. 9, but may for example be the structure shown in FIG. 10. In the structure shown in this figure, with the N-type substrate 50 as a base, the P wells 57 and 58 are formed, and within the P well 57 an N well 59 is formed, in a triple-well structure. The well voltage $V_{Pi}$ is the back-gate voltage of the NMOS transistor constituting a logic element, and the well voltage $V_{Ni}$ is the back-gate voltage of the PMOS transistor constituting a logic element.

Figure 8:
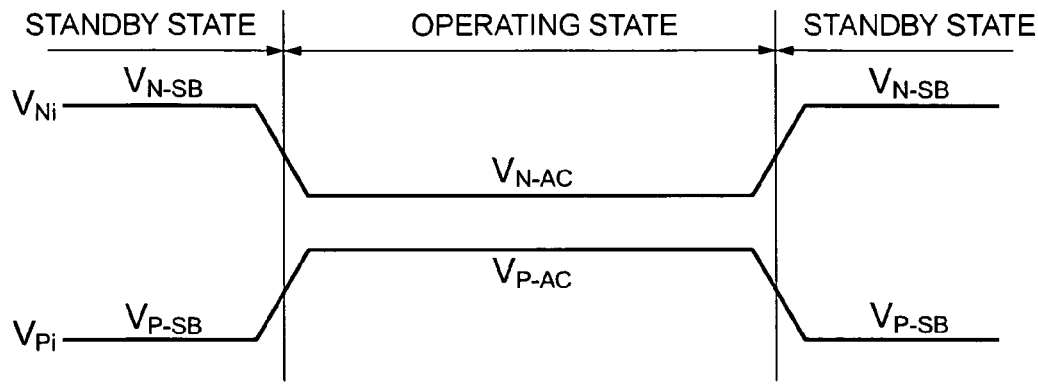
FIG. 8 is a back-gate voltage timing chart.

FIG. 8 is a timing chart showing changes in back-gate voltages in the operating and standby states in the circuit block 20-$i$. As explained above, the master unit 10 controls the back-gate voltages in the standby and operating states in the circuit block 20-$i$ according to each of the states of a finite state machine which makes transitions in event-driven fashion. When the circuit block 20-$i$ is in the standby state, the master unit 10 raises the back-gate voltage $V_{Ni}$ above the voltage $V_{N-AC}$ in the operating state, taking this to be $V_{N-SB}$, and lowers the back-gate voltage $V_{Pi}$ below the voltage $V_{P-AC}$ in the operating state, taking this to be $V_{P-SB}$. By this means, the threshold voltages of transistors constituting logic elements can be increased, so that the leakage current of the circuit block 20-$i$ during standby can be reduced. On the other hand, when the circuit block 20-$i$ is in the operating state, the master unit 10 lowers the back-gate voltage $V_{Ni}$ below the standby voltage $V_{N-SB}$, taking this to be $V_{N-AC}$, and raises the back-gate voltage $V_{Pi}$ above the standby voltage $V_{P-SB}$, taking this to be $V_{P-AC}$. By this means, the threshold voltage of transistors constituting logic elements is lowered, so that low-voltage driving becomes possible.

In this way, by means of this embodiment a semiconductor integrated circuit on a VLSI chip is divided into a plurality of circuit blocks 20-1, 20-2, . . . , 20-M, and the back-gate voltages of transistors forming logic elements in circuit blocks 20-1, 20-2, . . . , 20-M in the standby state are controlled such that the transistor threshold voltages are raised, so that leakage currents during standby can be greatly reduced. The reduction of power consumption is particularly important in portable electronic equipment such as cellular phones which employ batteries as the main power source, so that this invention is highly useful and can be employed in the fabrication of widely-used low-power-consumption SOC (System-On-Chip), SOB (System-On-Board), and SOP (System-On-Panel) devices. Also, even when a circuit block which is subject to power distribution control is to be newly added, deleted, or modified, accommodation is possible by assembling the control logic anew and redesigning the finite state machine. Of course in this invention, any switching elements having a well structure which perform back-gate voltage control may be employed, and need not be MOS transistors.

Embodiment 2 of the Invention

Figure 11:
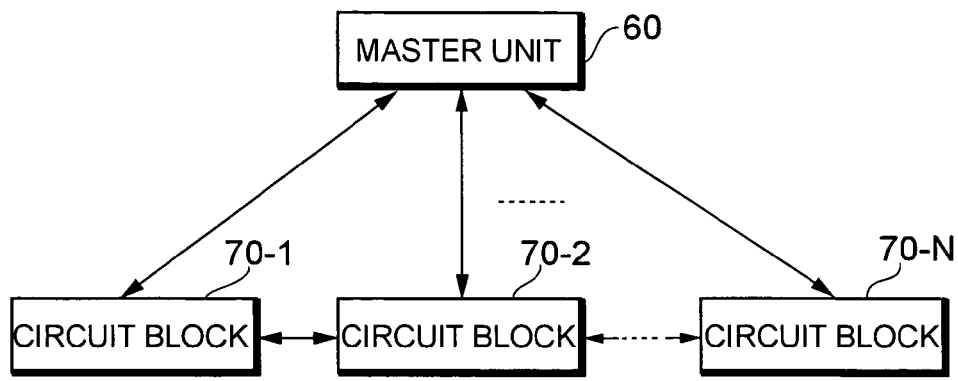
FIG. 11 is the system block diagram of a second embodiment.

FIG. 11 is a block diagram of a system which performs active or passive back-gate voltage control by a CSP (Communicating Sequential Processes) method, with the plurality of circuit blocks comprised by the semiconductor integrated circuits communicating with each other. The semiconductor integrated circuits on the VLSI chip are logically divided into N circuit blocks (logical blocks) 70-1, 70-2, . . . , 70-N capable of transitions from a standby state to an operating state and from an operating state to a standby state. In order to reduce the power consumption for the entire VLSI chip, it is desirable that the semiconductor integrated circuits be divided into numerous circuit blocks, categorized by function. An asynchronous system is formed in which these circuit blocks 70-1, 70-2, . . . , 70-N do not operate based on a global clock for central control, but instead, when it is judged that the individual circuit blocks 70-1, 70-2, . . . , 70-N must operate actively or passively, the circuit blocks are supplied with power. The master unit 60 (control circuit)

is a circuit block which primarily communicates either directly or indirectly with external circuits and with the circuit blocks 70-1, 70-2, . . . , 70-N to execute functions to regulate the entire system, but does not directly control the supply of power to the circuit blocks 70-1, 70-2, . . . , 70-N. Power supply to each of the circuit blocks is controlled directly by a power supply circuit incorporated into or accompanying each circuit block; but the timing of transitions from the operating state to the standby state is determined actively by each circuit block itself, and transitions from the standby state to the operating state are determined passively upon receiving a request from another circuit block. With this timing a circuit block itself controls the supply of power through the incorporated or accompanying power supply control circuit.

Figure 12:
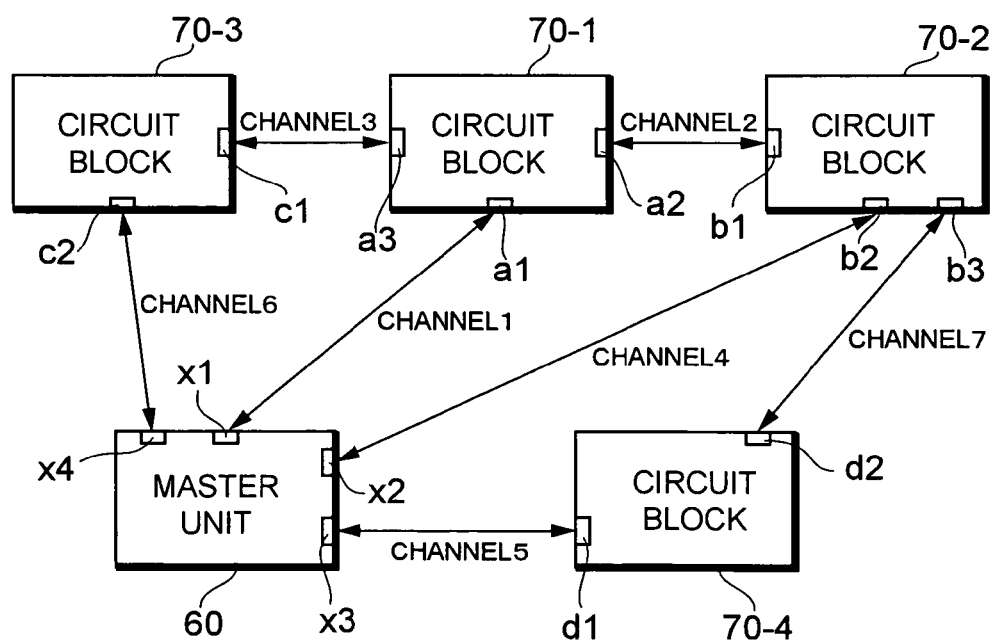
FIG. 12 explains power distribution control using a CSP method.

FIG. 12 explains the manner of back-gate voltage control of circuit blocks using a CSP method. For convenience in explanation, an example of four circuit blocks, 70-1 to 70-4, is explained, but in actuality back-gate voltage control is performed for N circuit blocks 70-1, 70-2, . . . , 70-N by means of communication between the circuit blocks 70-1, 70-2, . . . , 70-N. Power supply to the circuit blocks 70-1 to 70-4 is controlled by event driving, and when it is judged that active operation is necessary, or it is judged that passive operation is necessary, power supply is received and circuit blocks operate. Each of the circuit blocks 70-1 to 70-4 is connected via a "channel" to the other circuit blocks 70-1 to 70-4 and to the master unit 60, and event driving is performed with local cooperation. A channel is connected at both ends to a "port".

In the example shown in the figure, the circuit block 70-1 comprises the ports a1, a2, a3; the circuit block 70-2 comprises the ports b1, b2, b3; the circuit block 70-3 comprises the ports c1, c2; the circuit block 70-4 comprises the ports d1, d2; and the master unit 60 comprises the ports x1, x2, x3. Focusing on the circuit block 70-1, the circuit block 70-1 is connected via the channels 1, 2, 3 to the master unit 60 and the circuit blocks 70-2 and 70-3.

In communications between ports via a channel, either an "Active" or a "Passive" attribute is assigned to all the ports. For example, when the circuit block 70-1 requests active data transfer to the circuit block 70-2 via the channel 2, the "Send Active" attribute is assigned to port a1 of the circuit block 70-1, and the "Receive Passive" attribute is assigned to port b1 of the circuit block 70-2 which is to passively receive the data transfer request. Conversely, when the circuit block 70-1 actively requests data transfer from the circuit block 70-2 via the channel 2, the "Receive Active" attribute is assigned to port a1, and the "Send Passive" attribute is assigned to port b1 of the circuit block 70-2 which is to passively perform data transfer. In communication between ports, two-phase or four-phase handshaking is performed by sending and receiving req/ack signals.

The circuit configuration of the power supply system for the circuit block 70-i can be similar to that of the above-described FIG. 3 or FIG. 7. When the circuit block 70-i has the circuit configuration shown in FIG. 3, in addition to control of the back-gate voltages $V_{Pi}$ and $V_{Ni}$ of transistors forming logic elements in the circuit block 70-i, the gate voltages $\phi_{Pi}$ and $\phi_{Ni}$ and the back-gate voltages $V_{NWi}$ and $V_{PWi}$ of the switching transistors must also be controlled. The well structure of the VLSI chip is the triple-well structure shown in the above FIG. 5 or FIG. 6. On the other hand, when the circuit block 70-i has the circuit configuration shown in FIG. 7, control of the back-gate voltages $V_{Pi}$ and $V_{Ni}$ of transistors forming logic elements in the circuit block 70-i is necessary. The well structure of the VLSI chip is the triple-well structure of the above FIG. 9 or FIG. 10.

In the above first embodiment, the master unit 10 controls the back-gate voltages in the circuit block 70-i; but in this embodiment, the back-gate voltages of the circuit block 70-i are controlled, actively or passively, by the "channels" and "ports" described above. "Channels" and "ports" are configured so as to always receive power and operate, regardless of the operating state of the circuit block 70-i.

Figure 13:
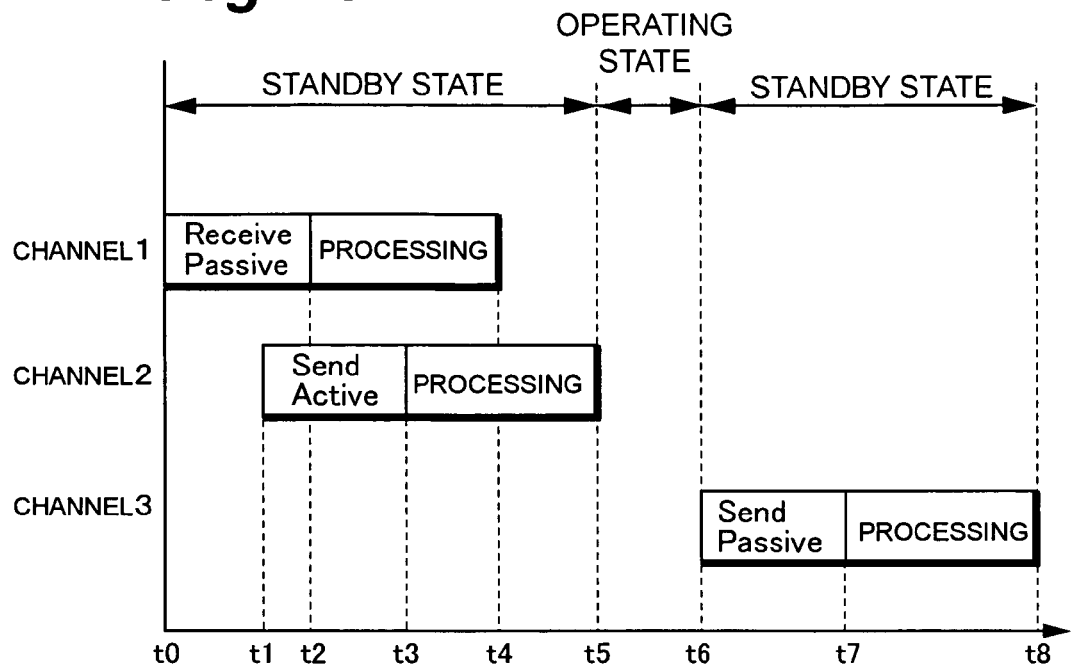
FIG. 13 is a timing chart of the supply of power to a circuit block.

FIG. 13 is a timing chart used to explain the timing of supply of power to a circuit block. Here, the explanation focuses on the circuit block 70-1, but timing is similar for the other circuit blocks. As explained above, the circuit block 70-1 is connected to the master unit 60 and circuit blocks 70-2 and 70-3 via the channels 1 to 3. At time $t_0$, the system is started, and when the circuit block 70-1 is to receive a data reception request in response to a request from the master unit 60, the Receive Passive attribute is assigned, and the desired operation processing is performed in the interval from time $t_2$ to time $t_4$. When the circuit block 70-1 actively requests data transmission to the circuit block 70-2 at time $t_1$ over channel 2, the Send Active attribute is assigned, and the desired operation processing is similarly performed in the interval between time $t_3$ and time $t_5$. When the circuit block 70-1 is to receive a data transmission request from the circuit block 70-3 at time $t_6$ via channel 3, the Send Passive attribute is assigned, and the desired operation processing is performed in the interval from time $t_7$ to time $t_8$.

In the interval from time $t_0$ to time $t_5$, and in the interval from time $t_6$ to time $t_8$, the circuit block 70-1 operates actively or passively (is in the operating state) through communications with the master unit 60 and with the circuit blocks 70-2 and 70-3, and the channels 1, 2, 3 and ports a1, a2, a3 control the back-gate voltages $V_{Pi}$ and $V_{Ni}$ such that the threshold voltages of logic elements constituting the circuit block 70-1 are decreased during these intervals. When the circuit block 70-1 receives power supplied via switching elements as shown in FIG. 3, the gate voltages $\phi_{Pi}$ and $\phi_{Ni}$ and the back-gate voltages $V_{NWi}$ and $V_{PWi}$ are controlled such that the switching elements are turned on. Specifically, the control method of FIG. 4 or of FIG. 8 may be employed.

On the other hand, in the interval from time $t_5$ to time $t_6$ the circuit block 70-1 is not required to operate (is in the standby state), and the channels 1, 2, 3 and ports a1, a2, a3 control the back-gate voltages $V_{Pi}$ and $V_{Ni}$ such that the threshold voltages of logic elements constituting the circuit block 70-1 are increased. When the circuit block 70-1 receives power via switching elements as shown in FIG. 3, the gate voltages $\phi_{Pi}$ and $\phi_{Ni}$ and back-gate voltages $V_{NWi}$ and $V_{PWi}$ are also controlled such that the switching elements are turned off. Specifically, the control method of FIG. 4 or of FIG. 8 may be employed.

In this way, by means of this embodiment finer control of back-gate voltages of the circuit blocks 70-1, 70-2, . . . , 70-N can be performed through a CSP method, and even when a circuit block is added, deleted or modified, the content and method of communication with related circuit blocks need only be redesigned, for excellent convenience in system reconfiguration.

Embodiment 3 of the Invention

Figure 14:
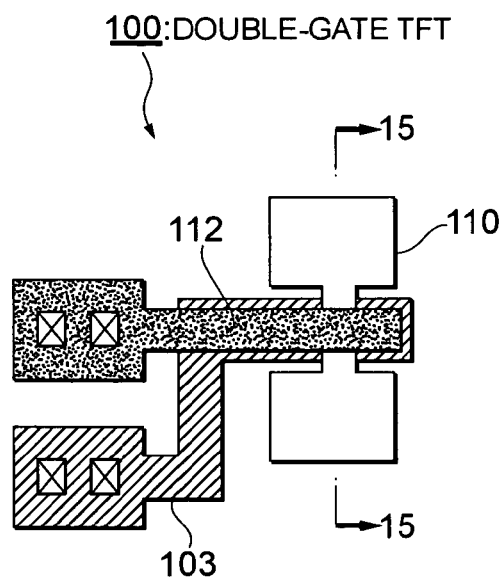
FIG. 14 is a cross-sectional view of a double-gate TFT.
Figure 15:
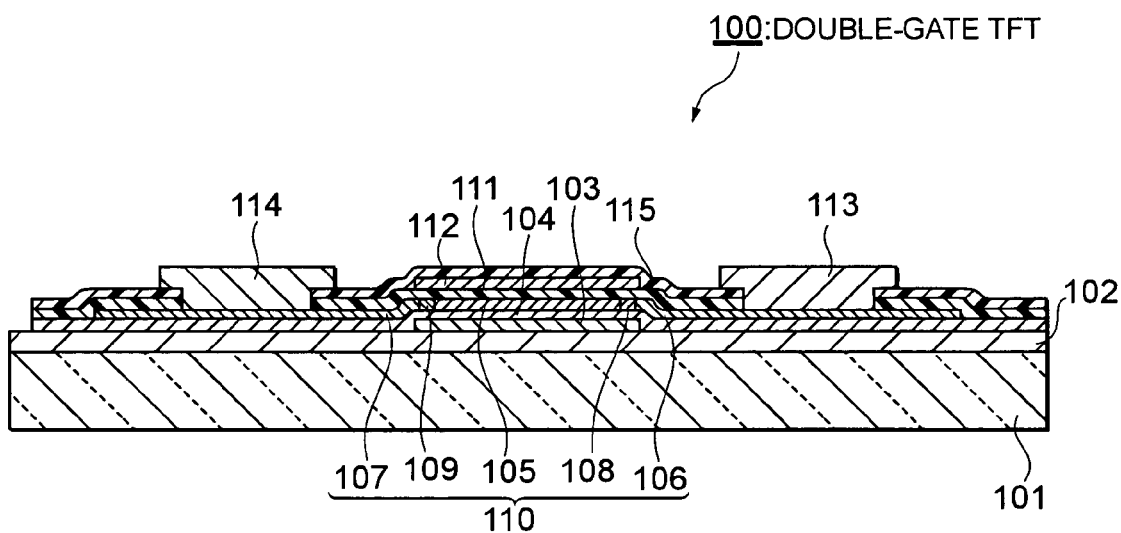
FIG. 15 is a plane view of a double-gate TFT.

FIG. 14 and FIG. 15 show a double-gate TFT (thin film transistor) 100. FIG. 14 is a plane view, and FIG. 15 is a cross-sectional view along line 15—15 in FIG. 14. The back-gate electrode 103 is formed on the insulating substrate 101, with an under layer 102 intervening. As the insulating substrate 101, for example, glass substrate, quartz substrate, plastic substrate, or similar can be used. On the upper surface of the back-gate electrode 103 and under layer 102 are stacked, in order, the back-gate insulating film 104, active layer 110, gate insulating film 111, gate electrode 112, and layer insulating film 115. The active layer 110 comprises island-shape polycrystalline silicon or similar, and comprises a channel region 105 formed between the two gates above and below, and a drain region 106 and source region 107 formed on either side thereof. The back-gate electrode 103 and gate electrode 112 are positioned in opposition with the channel region 105 intervening. The drain electrode 113 and source electrode 114 are formed via contact holes in the drain region 106 and source region 107 respectively. Here, the back-gate electrode 103 is, when the TFT structure is the top-gate type, the electrode formed on the bottom side (the insulating substrate side) so as to oppose the gate electrode 112, and when the TFT structure is the bottom-gate type, is the electrode formed on the top side so as to oppose the gate electrode 112. The TFT structure shown in the figures is the top-gate type, but a bottom-gate type structure may be used.

In this embodiment, the NMOS transistors or PMOS transistors constituting logic elements in the circuit blocks 20-1, 20-2, . . . , 20-M or the PMOS transistors MPi or NMOS transistors MNi used as switching elements to connect and disconnect power to the circuit blocks 20-$i$ in the above-described first embodiment, or the NMOS transistors or PMOS transistors constituting logic elements in the circuit blocks 70-1, 70-2, . . . , 70-N in the above-described second embodiment, comprise double-gate TFTs 100. When a double-gate TFT 100 is in the standby state, by adjusting the voltage of the back-gate electrode 103 such that the threshold voltage of the transistor is increased, the leakage current can be reduced satisfactorily. On the other hand, when a double-gate TFT 100 is in the operating state, by adjusting the voltage of the back-gate electrode 103 such that the transistor threshold voltage is reduced, the turn-on current can be increased and driving capacity can be enhanced. Control of the voltage of the back-gate electrode 103 may be event-driven control by the master unit 10, similarly to the first embodiment, or may be active or passive control by a CSP method, similarly to the second embodiment. When logic elements of the circuit blocks 20-1, 20-2, . . . , 20-M or of the circuit blocks 70-1, 70-2, . . . , 70-N comprise double-gate TFTs 100, by using the same logic to control the gate electrodes 112 and back-gate electrodes 103, the transistor rise time or fall time can be shortened, and switching speed can be increased. And, by increasing the driving capacity, transistor sizes can be reduced, and higher-density integration becomes possible.

Further, compared with the bulk-structure MOS transistors of the explanations of the first and second embodiments, double-gate TFTs 100 have no semiconductor wells, so that the drain capacitance is due only to the reverse-biased region at the channel-drain interface, and so is extremely small; consequently the charge/discharge amounts during switching are extremely small compared with the gate capacitances of transistors on the driven side. As a result faster operation and lower power consumption than when using bulk-structure MOS transistors having the same mobility are possible. Also, because double-gate TFTs 100 have an insulating substrate 101 and under layer 102, the capacitance due to wiring and power supply lines is extremely small. Consequently, even faster operation and lower power consumption than in the case of bulk-structure MOS transistors having the same mobility are possible.

As the structure of such a double-gate TFT 100, it is desirable that LDD (Lightly Doped Drain) regions 108, 109 be formed (see FIG. 15), in which for example the end faces of the channel region adjoining the drain region 106 or source region 107 are lightly doped with impurities. By adding the LDD regions 108, 109, the electric field in the drain end depletion region is weakened, and phonon-assisted tunneling accompanying the Poble-Frenkel effect, involving rapid creation of electron-hole pairs, is suppressed, so that only thermal excitation occurs and the leakage current (off current) of the double-gate TFT 100 can be reduced. Further, it is desirable that the gate electrode 112 and back-gate electrode 103 be formed in substantially the same shape such that the shapes when projected onto the channel region 105 overlap (see FIG. 14). By enclosing the channel region 105, on the top and bottom, between the gate electrode 112 and back-gate electrode 103, the subthreshold factor can be made small, and the electric field mobility can be improved. Further, it is desirable that the shape of the back-gate electrode 103 projected onto the channel region 105 be of a shape (or size) which overlaps wholly or in part with the LDD regions 108, 109. By this means, both reduction of leakage current when the transistor is in the standby state, and improvement of the electric field mobility when the transistor is in the operating state can be achieved.

Embodiment 4 of the Invention

Figure 16:
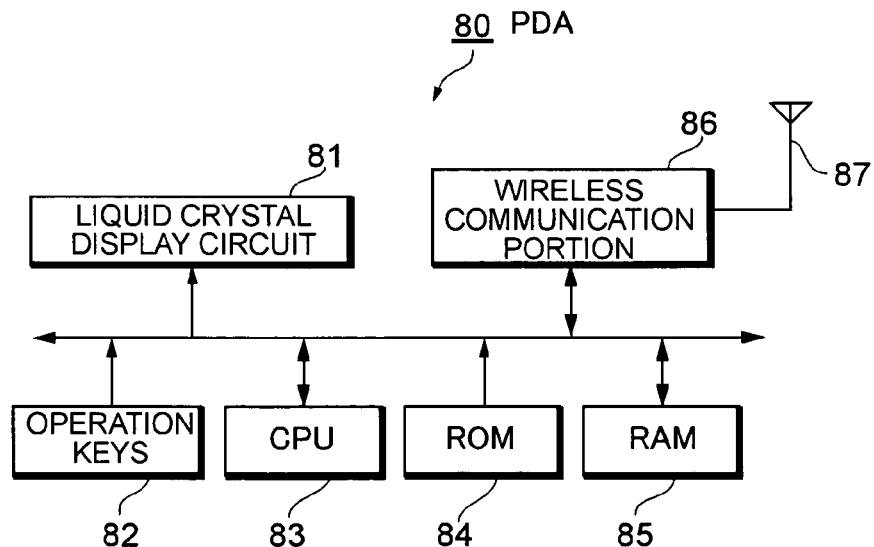
FIG. 16 is a block diagram of a PDA to which this invention is applied.

Next, an example of electronic equipment comprising a semiconductor integrated circuit of this invention is described. FIG. 16 is a block diagram of a portable-type personal digital assistant (PDA) comprising communication functions. As indicated in the figure, the PDA 80 comprises a liquid crystal display circuit 81, operation keys 82, a CPU 83, ROM 84, RAM 85, a wireless communication portion 86, and an antenna 87. The CPU 83, wireless communication portion 86, and similar comprise IC chips in which a semiconductor integrated circuit of this invention is mounted, to achieve reduced power consumption for the device as a whole. This is particularly useful for portable information terminals such as PDAs in view of the need to extend battery service lifetimes.

Figure 17:
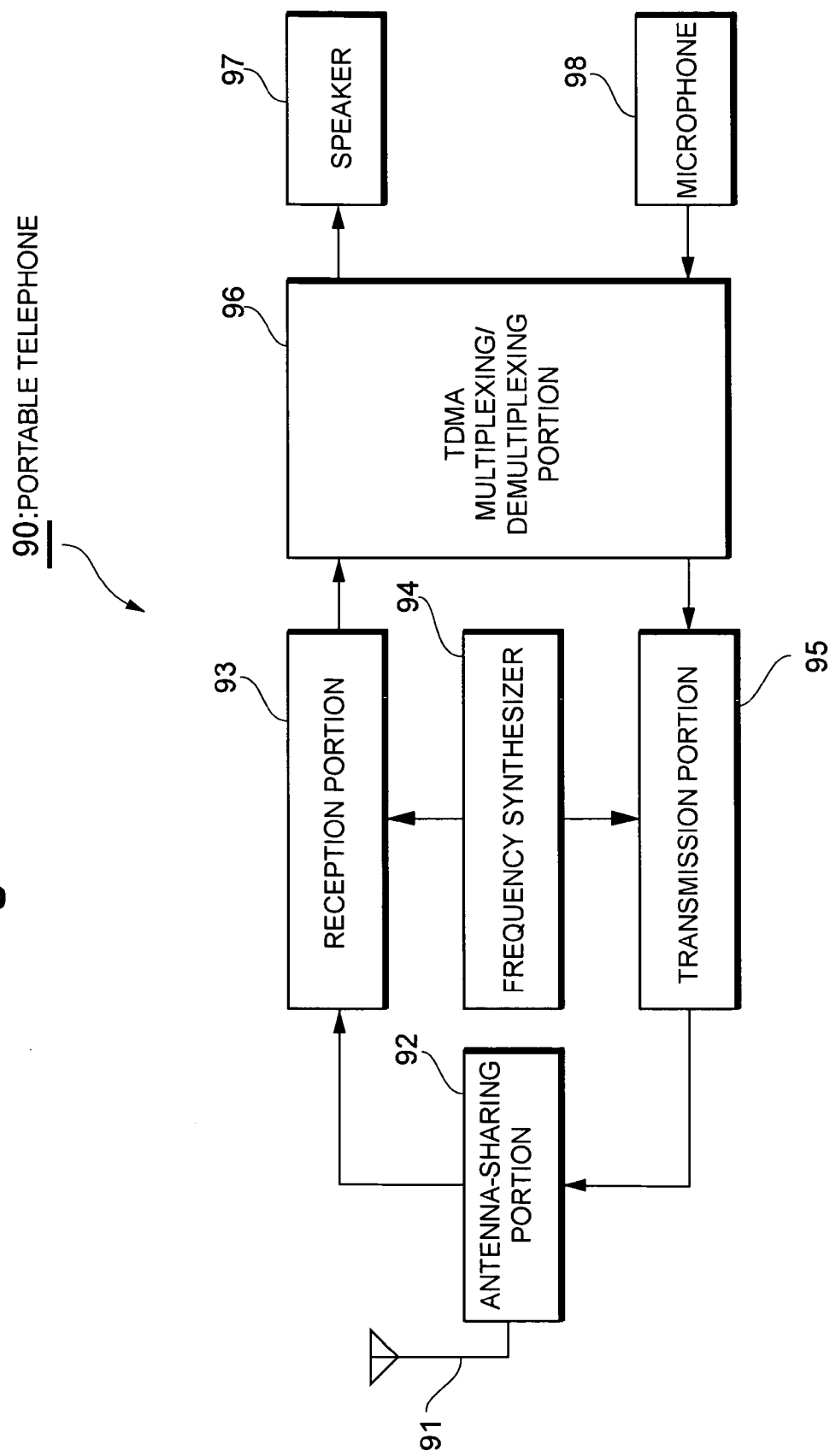
FIG. 17 is a block diagram of a portable telephone to which this invention is applied.

FIG. 17 is a block diagram of a portable telephone employing digital communication. The portable telephone 90 comprises an antenna 91, antenna-sharing portion 92, reception portion 93, frequency synthesizer 94, transmission portion 95, TDMA multiplexing/demultiplexing portion 96, speaker 97, and microphone 98. The reception portion 93, transmission portion 95, TDMA multiplexing/demultiplexing portion 96 and similar comprise IC chips in which a semiconductor integrated circuit of this invention is mounted, to achieve reduced power consumption for the device as a whole.

In more detail, the reception portion 93 is configured comprising a high-frequency amplifier, receiving mixer, IF amplifier, delayed detection circuit and similar; these components are comprised by one, or by two or more IC chips on which are mounted semiconductor integrated circuits of this invention. Similarly, the transmission portion 95 is configured comprising an IQ signal generation circuit, orthogonal modulator, transmitting mixer, transmission power amplifier and similar; these components are comprised by one, or by two or more IC chips on which are mounted semiconductor integrated circuits of this invention.

Because reduced power consumption is demanded of portable-type electronic equipment in particular, by configuring such electronic equipment with IC chips incorporating semiconductor integrated circuits of this invention, the service lifetime of batteries installed in the electronic equipment can be extended. Electronic equipment configured using IC chips incorporating semiconductor integrated circuits of this invention may include, in addition to PDAs and portable telephones, battery-driven portable equipment, audio recording/playback equipment, video recording/playback equipment, sheet-shape computers, electronic paper, wearable computers, IC cards, smart cards, camcorders, personal computers, head-mounted displays, projectors, wearable health monitoring equipment, wearable toys, ubiquitous wireless sensors, RFIDs, affixable thermometers, fax machines with display functions, portable TV sets, electronic organizers, electronic bulletin boards, advertising displays, wireless tags with display functions, SOP (System-On-Panel) devices, SOG (System-On-Glass) devices, SOB (System-On-Board) devices, and similar.

I claim:

1. A semiconductor integrated circuit, comprising:
 a plurality of circuit blocks capable of transitions from an operating state to a standby state and from a standby state to an operating state; and,
 a control circuit which controls, in event-driven fashion, the back-gate voltages of transistors forming logic elements of said circuit blocks, based on a finite state machine that stipulates in advance each of the state transitions of said plurality of circuit blocks;
 wherein said circuit blocks are always powered on.

2. The semiconductor integrated circuit according to claim 1, wherein said control circuit controls said back-gate voltages such that, when said circuit blocks are in the standby state, the threshold voltages of said transistors are increased.

3. The semiconductor integrated circuit according to claim 1, wherein said control circuit controls said back-gate voltages such that, when said circuit blocks are in the operating state, the threshold voltages of said transistors are decreased.

4. The semiconductor integrated circuit according to claim 1, further comprising:
 a common power supply line to supply power to each of said plurality of circuit blocks;
 a common ground line to ground each of said plurality of circuit blocks; and
 switching elements to perform electrical connection/disconnection between said circuit blocks and at least either one of said common power supply line and said common ground line,
 wherein said control circuit controls the connection/disconnection of said switching elements in an event-driven fashion, based on said finite state machine.

5. A semiconductor integrated circuit, comprising:
 a plurality of circuit blocks capable of transitions from an operating state to a standby state and from a standby state to an operating state;
 channels to actively issue operation requests or to passively receive operation requests, through communications between said circuit blocks by a CSP (Communicating Sequential Processes) method; and,
 ports connecting circuit blocks to each other via said channels;
 wherein said channels and ports control the back-gate voltages of transistors constituting logic elements of said circuit blocks, according to the operating states of said circuit blocks
 wherein said circuit blocks are always powered on.

6. The semiconductor integrated circuit according to claim 5, wherein said channels and ports control said back-gate voltages such that, when said circuit blocks are in the standby state, the threshold voltages of said transistors are increased.

7. The semiconductor integrated circuit according to claim 5, wherein said channels and ports control said back-gate voltages such that, when said circuit blocks are in the operating state, the threshold voltages of said transistors are decreased.

8. The semiconductor integrated circuit according to claim 5, further comprising:
 a common power supply line to supply power to each of said plurality of circuit blocks;
 a common ground line to ground each of said plurality of circuit blocks; and
 switching elements to perform electrical connection/disconnection between said circuit blocks and at least either one of said common power supply line and said common ground line,
 wherein said channels and ports control the connection/disconnection of said switching elements according to the operating states of said circuit blocks.

9. The semiconductor integrated circuit according to claim 1, wherein said transistors are double-gate TFTs.

10. The semiconductor integrated circuit according to claim 9, wherein said double-gate TFTs has the drain and source extensions of LDD (Lightly Doped Drain) structure.

11. The semiconductor integrated circuit according to claim 9, wherein, in said double-gate TFTs, the gate electrode and back-gate electrode are positioned in opposition with the channel region therebetween, and are formed in substantially the same shape such that the shapes thereof projected onto said channel region overlap.

12. The semiconductor integrated circuit according to claim 10, wherein said back-gate electrode is formed such that the shape projected onto the channel region overlaps wholly or partially with said LDD (Lightly Doped Drain) region.

13. Electronic equipment comprising a semiconductor integrated circuit according claim 1.

14. A back-gate voltage control method, wherein the back-gate voltages of transistors forming logic elements of a plurality of circuit blocks capable of transitions from an operating state to a standby state and from a standby state to an operating state are controlled based on a finite state machine which stipulates in advance each of the state transitions of said plurality of circuit blocks;
 wherein said circuit blocks are always powered on.

15. The back-gate voltage control method according to claim 14, wherein said back-gate voltages are controlled such that, when said circuit blocks are in the standby state, the threshold voltages of said transistors are increased.

16. The back-gate voltage control method according to claim 14, wherein said back-gate voltages are controlled such that, when said circuit blocks are in the operating state, the threshold voltages of said transistors are decreased.

17. A back-gate voltage control method, to control back-gate voltages in a semiconductor integrated circuit comprising a plurality of circuit blocks capable of transitions from an operating state to a standby state and from a standby state to an operating state, channels to actively issue operation requests or to passively receive operation requests through communications between said circuit blocks by a CSP (Communicating Sequential Processes) method, and ports connecting circuit blocks to each other via said channels, wherein said channels and ports control the back-gate voltages of transistors constituting logic elements of said circuit blocks, according to the operating states of said circuit blocks, wherein said circuit blocks are always powered on.

18. The back-gate voltage control method according to claim 17, wherein said back-gate voltages are controlled such that, when said circuit blocks are in the standby state, the threshold voltages of said transistors are increased.

19. The back-gate voltage control method according to claim 17, wherein said back-gate voltages are controlled such that, when said circuit blocks are in the operating state, the threshold voltages of said transistors are decreased.

20. A semiconductor integrated circuit, comprising:
a plurality of circuit blocks capable of transitions from an operating state to a standby state and from a standby state to an operating state; and,
a control circuit which controls, in event-driven fashion, the back-gate voltages of double gate TFTs forming logic elements of said circuit blocks, based on a finite state machine that stipulates in advance each of the state transitions of said plurality of circuit blocks.

21. The semiconductor integrated circuit according to claim 20, wherein said double-gate TFTs has the drain and source extensions of LDD (Lightly Doped Drain) structure.

22. The semiconductor integrated circuit according to claim 20, wherein, in said double-gate TFTs, the gate electrode and back-gate electrode are positioned in opposition with the channel region therebetween, and are formed in substantially the same shape such that the shapes thereof projected onto said channel region overlap.

23. The semiconductor integrated circuit according to claim 20, wherein said back-gate electrode is formed such that the shape projected onto the channel region overlaps wholly or partially with said LDD (Lightly Doped Drain) region.

* * * * *